(12) United States Patent
Kim et al.

(10) Patent No.: US 12,362,226 B2
(45) Date of Patent: Jul. 15, 2025

(54) METHOD FOR FORMING A HANDLING SUBSTRATE FOR A COMPOSITE STRUCTURE INTENDED FOR RF APPLICATIONS AND HANDLING SUBSTRATE

(71) Applicant: Soitec, Bernin (FR)

(72) Inventors: Young-Pil Kim, Grenoble (FR); Daniel Delprat, Crolles (FR); Luciana Capello, Grenoble (FR); Isabelle Bertrand, Bernin (FR); Frédéric Allibert, Grenoble (FR)

(73) Assignee: Soitec, Bernin (FR)

( * ) Notice: Subject to any disclaimer, the term of this patent is extended or adjusted under 35 U.S.C. 154(b) by 421 days.

(21) Appl. No.: 17/756,244

(22) PCT Filed: Nov. 25, 2020

(86) PCT No.: PCT/FR2020/052171
§ 371 (c)(1),
(2) Date: May 19, 2022

(87) PCT Pub. No.: WO2021/111062
PCT Pub. Date: Jun. 10, 2021

(65) Prior Publication Data
US 2023/0005787 A1    Jan. 5, 2023

(30) Foreign Application Priority Data
Dec. 5, 2019  (FR) ........................................ 1913780

(51) Int. Cl.
*H01L 27/12*     (2006.01)
*H01L 21/02*     (2006.01)
(Continued)

(52) U.S. Cl.
CPC .. *H01L 21/76254* (2013.01); *H01L 21/02027* (2013.01); *H01L 23/66* (2013.01); *H10D 86/201* (2025.01)

(58) Field of Classification Search
CPC ......... H01L 21/76254; H01L 21/02027; H01L 21/02002; H01L 21/7624; H01L 23/66;
(Continued)

(56) References Cited

U.S. PATENT DOCUMENTS

| 4,855,254 A | 8/1989 | Eshita et al. |
| 2013/0049013 A1* | 2/2013 | Shimada ............ H10D 62/8325 |
| | | 257/77 |

(Continued)

FOREIGN PATENT DOCUMENTS

| CN | 110178211 A | 8/2019 |
| EP | 3574519 B1 | 8/2020 |

(Continued)

OTHER PUBLICATIONS

Taiwanese Office Action for Application No. 11221253870 dated Dec. 12, 2023, 7 pages with English translation.
(Continued)

*Primary Examiner* — Niki H Nguyen
(74) *Attorney, Agent, or Firm* — TraskBritt

(57) ABSTRACT

A handle substrate for a composite structure comprises a base substrate including an epitaxial layer of silicon on a monocrystalline silicon wafer obtained by Czochralski pulling, a passivation layer on and in contact with the epitaxial layer of silicon, and a charge-trapping layer on and in contact with the passivation layer. The monocrystalline silicon wafer of the base substrate exhibits a resistivity of between 10 and 500 ohm·cm, while the epitaxial layer of silicon exhibits a resistivity of greater than 2000 ohm·cm and a thickness ranging from 2 to 100 microns. The passi-
(Continued)

vation layer is amorphous or polycrystalline. A method is described for forming such a substrate.

20 Claims, 1 Drawing Sheet

(51) Int. Cl.
  *H01L 21/762* (2006.01)
  *H01L 23/66* (2006.01)
  *H10D 86/00* (2025.01)
(58) Field of Classification Search
  CPC ............ H01L 27/1203; H01L 29/0684; H01L 21/02529; H01L 21/02447; H01L 21/02532; H01L 21/02381; H01L 21/762; H01L 2924/13091; H01L 21/0245; H01L 21/28; H01L 21/324; H01L 21/02; H01L 21/0445; H01L 21/02444; H01L 21/02107; H01L 21/02483; H01L 21/02565; H10D 62/149; H10D 62/156; H10D 62/832; H10D 62/292; H10D 64/017; H10D 30/0291; H10D 30/62; H10D 64/411; H10D 18/00; H10D 30/014; H10D 30/024; H10D 30/025; H10D 30/0275; H10D 30/63; H10D 12/032; H10D 12/417; H10D 12/418; H10D 18/655; H10D 30/021; H10D 62/8171; H10D 62/393; H10D 62/111; H10D 62/81; H10D 30/60; H10D 12/441; H10D 12/031; H10D 30/66; H10D 62/8325; H10D 62/364; H10D 62/151; H10D 30/637; H10D 30/83; H10D 30/87
  See application file for complete search history.

(56) References Cited

U.S. PATENT DOCUMENTS

| | | | |
|---|---|---|---|
| 2018/0033681 A1* | 2/2018 | Ishikawa | ............... H10D 86/01 |
| 2018/0114720 A1 | 4/2018 | Wang et al. | |
| 2018/0158721 A1* | 6/2018 | Libbert | ............ H01L 21/02164 |

FOREIGN PATENT DOCUMENTS

| | | |
|---|---|---|
| JP | 01-162326 A | 6/1989 |
| JP | 2012-199550 A | 10/2012 |
| JP | 2013-513234 A | 4/2013 |
| JP | 2016-164951 A | 9/2016 |
| JP | 2018-507562 A | 3/2018 |
| JP | 2019-536260 A | 12/2019 |
| KR | 10-1992-0004173 | 5/1992 |
| TW | 201834222 A | 9/2018 |
| WO | 2011/067394 A1 | 6/2011 |
| WO | 2016/140850 A1 | 9/2016 |
| WO | 2017/167923 A1 | 10/2017 |
| WO | 2018/080772 A1 | 5/2018 |
| WO | 2018/137937 A1 | 8/2018 |

OTHER PUBLICATIONS

International Search Report for International Application No. PCT/FR2020/052171 dated Mar. 11, 2022, 2 pages.
International Written Opinion for International Application No. PCT/FR2020/052171 dated Mar. 11, 2022, 6 pages.
Japanese Notice of Reasons for Rejection for Application No. 2022-528160 dated Sep. 24, 2024, 4 pages.
Korean Office Action for Application No. 10-2022-7022935 dated Oct. 16, 2024, 20 pages with machine translation.

* cited by examiner

METHOD FOR FORMING A HANDLING SUBSTRATE FOR A COMPOSITE STRUCTURE INTENDED FOR RF APPLICATIONS AND HANDLING SUBSTRATE

CROSS-REFERENCE TO RELATED APPLICATIONS

This application is a national phase entry under 35 U.S.C. § 371 of International Patent Application PCT/FR2020/052171, filed Nov. 25, 2020, designating the United States of America and published as International Patent Publication WO 2021/111062 A1 on Jun. 10, 2021, which claims the benefit under Article 8 of the Patent Cooperation Treaty to French Patent Application Serial No. FR1913780, filed Dec. 5, 2019.

TECHNICAL FIELD

The present disclosure relates to a handle substrate for a composite substrate compatible with high performance RF applications. The present disclosure also relates to a method for the formation of such a handle substrate.

BACKGROUND

High resistivity (HR) silicon substrates are the most commonly used handle substrates for making RF devices. An HR silicon substrate usually exhibits a resistivity of greater than 1,000 ohm·cm and more generally of greater than 5,000 ohm·cm.

Composite structures such as SOI (silicon on insulator) with HR silicon handle substrates, comprising or not comprising a charge-trapping layer between the handle substrate and the buried oxide, are well known in the field of radiofrequencies (RF). In particular, composite structures having a charge-trapping layer guarantee high performance qualities of the RF devices produced on the structures, provided that the charge-trapping layer does not suffer damage when the structures are exposed to high temperatures, for example, during its manufacture or during the manufacture of RF devices. For example, when a charge-trapping layer made of polysilicon recrystallizes, even partially, the RF performance qualities of the composite structure and the integrated devices that are formed thereon are affected, which is obviously not desirable.

Another problem arises from the supply of HR substrates, which is becoming increasingly restricted, in parallel with the increase in the manufacture of RF devices. As a result, the material is becoming increasingly expensive.

BRIEF SUMMARY

The present disclosure proposes an alternative solution for providing a handle substrate suitable for composite structures on which high performance RF devices can be produced and for facilitating the supply and manufacturing processes.

With a view to achieving this aim, a handle substrate for a composite structure is proposed, the handle substrate comprising:
- a base substrate formed of an epitaxial layer of silicon on a monocrystalline silicon wafer of Cz type, i.e., obtained by Czochralski pulling, having a resistivity of between 10 and 500 ohm·cm, the epitaxial layer of silicon exhibiting a resistivity of greater than 2,000 ohm·cm and a thickness ranging from 2 to 100 microns;
- a passivation layer on and in contact with the epitaxial layer of silicon, the passivation layer being amorphous or polycrystalline; and
- a charge-trapping layer on and in contact with the passivation layer.

According to other advantageous and non-limiting characteristics of the present disclosure, taken individually or according to any technically achievable combination:
- the passivation layer is a layer of silicon carbide formed by carbonization of the surface of the epitaxial layer of silicon; and
- the passivation layer is a layer of silicon nitride formed by nitridation of the surface of the epitaxial layer of silicon.

The present disclosure also relates to a composite structure for radiofrequency applications comprising:
- a handle substrate as above;
- a dielectric layer on and in contact with the passivation layer; and
- a thin film on the dielectric layer, suitable for radiofrequency devices.

The present disclosure relates finally to a process for the formation of a handle substrate for a composite structure, the process comprising:
- a) the provision of a monocrystalline silicon wafer obtained by Czochralski pulling having a resistivity of between 10 and 500 ohm·cm;
- b) the growth of an epitaxial layer of silicon on the monocrystalline silicon wafer obtained by Czochralski pulling to form a base substrate, the epitaxial layer of silicon exhibiting a resistivity of greater than 2,000 ohm·cm and a thickness ranging from 2 to 100 microns;
- c) the formation of a passivation layer on the epitaxial layer of silicon, the passivation layer being amorphous or polycrystalline; and
- d) the growth of a polycrystalline charge-trapping layer on the passivation layer.

According to other advantageous and non-limiting characteristics of the present disclosure, taken individually or according to any technically achievable combination:
- stage c) comprises a carbonization of the surface of the epitaxial layer of silicon, so as to form a passivation layer made of polycrystalline silicon carbide;
- the carbonization of stage c) comprises the exposure of the base substrate to a single carbon precursor at a pressure below atmospheric pressure in order to form a passivation layer made of polycrystalline silicon carbide of at least 5 nm in thickness on the surface of the epitaxial layer of silicon;
- the single carbon precursor exhibits a temperature of between 700° C. and 1,200° C.;
- stage c) comprises a nitridation of the surface of the epitaxial layer of silicon, so as to form a passivation layer made of amorphous silicon nitride;
- the passivation layer exhibits a thickness of at least 10 nm;
- the charge-trapping layer has a thickness of greater than 5 or 10 microns;
- the charge-trapping layer is made of polycrystalline silicon;
- stages b), c) and d) are all carried out successively in situ in epitaxy equipment; and
- stage b) is carried out in a first reactor and stages c) and d) are carried out in a second reactor, and in which the transfer of the base substrate from the first reactor to the second reactor is carried out without breaking the vacuum.

BRIEF DESCRIPTION OF THE DRAWINGS

Other characteristics and advantages of the present disclosure will become apparent from the detailed description of example embodiments of the present disclosure below, which refers to the attached figures, among which.

DETAILED DESCRIPTION

In the descriptive part, the same references can be used in the figures to denote elements of the same type. The figures are diagrammatic representations that, for the purposes of readability, are not to scale. In particular, the thicknesses of the layers along the z axis are not to scale with respect to the lateral dimensions along the x and y axes; and the thicknesses of the layers with respect to one another are not necessarily respected in the figures.

Figure 1:
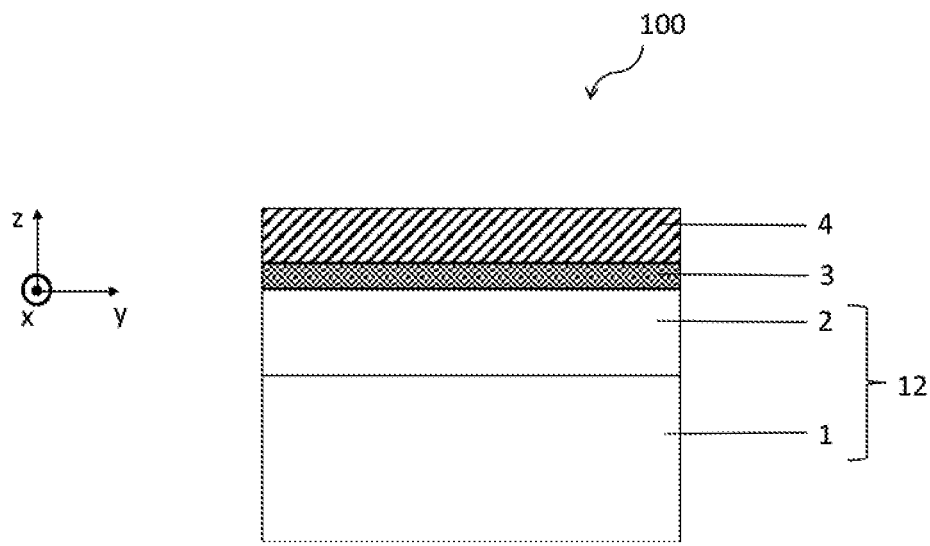
FIG. 1 represents a handle substrate according to the present disclosure.

FIG. 1 diagrammatically represents a handle substrate 100 for a composite substrate according to the present disclosure. The handle substrate 100 can be provided in the form of a circular slice, of standardized size, for example, 200 mm or 300 mm, indeed even 450 mm, in diameter. However, the present disclosure is in no way limited to these dimensions or to this shape.

The handle substrate 100 comprises a base substrate 12 formed by an epitaxial layer 2 of silicon positioned on a silicon wafer 1. The silicon wafer 1 generally has a thickness of several hundred microns and exhibits a standard resistivity ranging from 10 to 500 ohm·cm. It may preferentially comprise monocrystalline silicon obtained by Czochralski pulling, which is a type of material widely available.

The epitaxial layer 2 of silicon exhibits a resistivity of greater than 2,000 ohm·cm, preferentially of between 2,000 ohm·cm and 20,000 ohm·cm. In this way, the density of the charges, holes or electrons liable to move in the epitaxial layer of silicon is limited. The epitaxial layer 2 has a thickness ranging from 2 to 100 microns.

The handle substrate 100 also comprises, on the base substrate 12, a charge-trapping layer 4. The function of the charge-trapping layer 4 is to trap any charge carrier possibly present in the handle substrate 100 and to limit its mobility.

For reasons of availability and of cost, the charge-trapping layer 4 is preferentially made of polycrystalline silicon. However, it can be formed from another semiconductor and polycrystalline material, or it can comprise a part made from another semiconductor and polycrystalline material. It may comprise, for example, germanium, silicon-germanium, and the like.

In all cases, the polycrystalline charge-trapping layer 4 exhibits a high resistivity, generally of greater than 3,000 ohm·cm. For this reason, this layer is not intentionally doped, that is to say that it exhibits a concentration of dopants of less than $10^{14}$ atoms/cm$^3$. It can be rich in nitrogen or in carbon in order to improve its resistivity characteristic.

The polycrystalline charge-trapping layer 4 can have a thickness of greater than 0.5 micron, or of greater than 5 microns, indeed even of greater than 10 microns. Whether its thickness is greater or less than these limits, the charge-trapping layer 4 can comprise grains with a size of between 10 nm and 1,000 nm.

The handle substrate 100 also comprises an amorphous or polycrystalline passivation layer 3 interposed between the base substrate 12 and the polycrystalline charge-trapping layer 4. The passivation layer 3 is formed directly on the epitaxial layer 2 of silicon and makes it possible to grow the polycrystalline charge-trapping layer 4 on the passivation layer 3. This passivation layer 3 prevents the charge-trapping layer 4 from recrystallizing during high temperature treatments.

The passivation layer 3 can thus remain in amorphous or polycrystalline form throughout the duration of implementation of the high temperature processes necessary to manufacture the handle substrate 100 and, later, the composite structure 110 and the RF devices. Generally, the thermal budget to be endured by the handle substrate 100 is on the order of a few hours to 10 hours, at temperatures ranging from 950° C. to 1,200° C.

The passivation layer 3 can be of different natures. Advantageously, it comprises a layer of polycrystalline silicon carbide formed by carbonization of the free surface of the epitaxial layer 2 of silicon. Alternatively, it can comprise a layer of silicon nitride formed by nitridation of the surface of the epitaxial layer of silicon.

Of course, other materials of a different nature might be used for the passivation layer 3, provided that it meets the requirements of microelectronics and retains its amorphous or polycrystalline structure after the global thermal balance up to completion of the RF devices.

In general, the passivation layer 3 can have a thickness of at least 2 nm and preferably a thickness of at least 10 nm.

The handle substrate 100 thus comprises the base substrate 12, formed by an epitaxial layer 2 of silicon positioned on a monocrystalline silicon wafer 1, the passivation layer 3 directly in contact with the epitaxial layer 2 of silicon, and a polycrystalline charge-trapping layer 4 on, and directly in contact with, the passivation layer 3. The handle substrate 100 may not incorporate other layers, in particular, electrically insulating layers, which might modify the properties of the handle substrate 100 proposed.

The handle substrate 100 can optionally comprise a dielectric layer 5 positioned directly on the charge-trapping layer 4. The dielectric layer 5, which is optional, can facilitate the assembly of the handle substrate 100 with another substrate. The dielectric layer 5 can be made of, for example, silicon oxide or silicon nitride.

Figure 2:
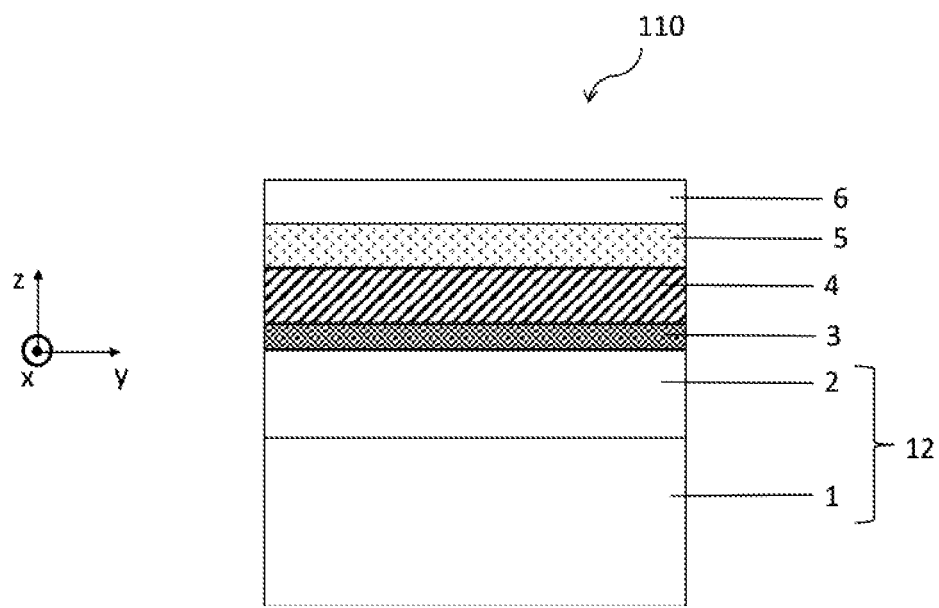
FIG. 2 represents a composite structure according to the present disclosure.

FIG. 2 represents a composite structure 110 according to the present disclosure, which comprises a handle substrate 100 as described above. As illustrated in this figure, the composite structure further comprises a dielectric layer 5 on the handle substrate 100 and a thin film 6, preferably made of monocrystalline material, on the dielectric layer 5. For example, and without limitation, the thin film 6 can be made of semiconductor material, such as silicon, or of piezoelectric material, such as lithium tantalate (LiTaO$_3$), lithium niobate (LiNbO$_3$), lithium aluminum oxide (LiAlO$_3$), barium titanate (BaTiO$_3$), lead zirconate titanate (PbZrTiO$_3$), potassium niobate (KNbO$_3$), barium zirconate (BaZrO$_3$), calcium titanate (CaTiO$_3$), lead titanate (PbTiO$_3$), potassium tantalite (KTaO$_3$), and the like.

The composite structure 110 of FIG. 2 can be formed in several ways from the handle substrate 100 but advantageously this formation comprises a stage of transfer of the thin film 6 onto the handle substrate 100. As is well known per se, this transfer is generally carried out by assembling the face of a donor substrate on the handle substrate 100. This can be carried out in the presence or absence of the dielectric layer 5.

When the thin film 6 is made of piezoelectric material, its crystalline orientation is chosen depending on the intended application. For surface acoustic wave filters made of lithium tantalate $LiTaO_3$, it is usual to choose an orientation of between 30° and 60° XY, or between 40° and 50° XY. For lithium niobate $LiNbO_3$, it is common to choose an orientation around 128° XY. However, the present disclosure is in no way limited to a particular crystalline orientation of a piezoelectric thin film. The donor substrate may have been withdrawn from an ingot made of ferroelectric material so that the donor substrate exhibits the chosen crystalline orientation. Alternatively, the donor substrate can comprise a thick layer made of ferroelectric material assembled with a support substrate.

After this assembly stage, the thickness of the donor substrate is reduced in order to form the thin film 6. This reduction stage can be carried out by mechanical or chemical thinning. It can also be carried out by fracturing at a fragile zone introduced beforehand into the donor substrate, for example, in accordance with the principles of the Smart Cut™ technology.

Stages for finishing the thin film 6, such as a polishing stage, a heat treatment under a reducing or neutral atmosphere or a sacrificial oxidation, can be linked together following the stage of reduction in thickness.

When the donor substrate is a bulk substrate, that is to say not comprising an integrated device, a composite structure 110 of the "semiconductor on insulator" (SOI) type is formed, in which the thin film 6 is a virgin semiconductor layer, comprising the handle substrate 100 according to the present disclosure. The composite structure 110 can then be used to form integrated devices.

When the donor substrate has been pretreated in order to form integrated devices on its surface, a thin film 6, which comprises the devices, can be transferred onto the handle substrate 100, forming a composite structure 110 with a layer of integrated devices on the handle substrate 100, according to the present disclosure.

The manufacture of the handle substrate 100 according to the present description is achievable by being provided with standard materials and by using conventional epitaxy/deposition equipment of the industry.

First, the method comprises a stage a), which involves providing a wafer 1 of monocrystalline silicon obtained by Czochralski pulling and having a resistivity ranging from 10 to 500 ohm·cm.

The following stage b) involves growing an epitaxial layer 2 of silicon on the silicon wafer 1, in order to form a base substrate 12. To do this, the silicon wafer 1 is placed in the reactor (or chamber) of epitaxy equipment. The silicon wafer 1 can be prepared before epitaxial growth, in order to clean its surface (that is to say, to remove organic or metallic dopants or particulate contaminations) and to remove from its surface a layer of native oxide. Cleaning is generally carried out with conventional wet cleaning treatments. The deoxidation can be carried out by wet or dry chemical etching, prior to placing the silicon wafer 1 in the reactor; it can also be carried out by exposing the silicon wafer 1 in the reactor to a reducing atmosphere at a temperature of at least 900° C.

Stage b) is targeted at growing an epitaxial layer 2 of intrinsic silicon. Its resistivity is greater than 2,000 ohm·cm and its thickness ranges from 2 to 100 microns.

Advantageously, the epitaxial growth of the silicon layer is carried out at high temperatures, ranging from 11,000° C. to 1,200° C., under atmospheric or reduced pressure with conventional sources of gaseous silicon, such as trichlorosilane (TCS), dichlorosilane (DCS) or silane ($SiH_4$).

The process according to the present disclosure then comprises a stage c), which involves forming an amorphous or polycrystalline passivation layer 3 on the epitaxial layer 2 of silicon.

According to a first option, the formation of the passivation layer 3 is carried out in the same reactor as that used for the epitaxial growth. This is advantageous since the base substrate 12 remains in situ, under a controlled atmosphere. On the one hand, this avoids breaking the vacuum and thus improves the crude treatment time and the overall efficiency of the process; on the other hand, it prevents the base substrate 12 from catching contaminants originating from the ambient atmosphere, such as boron particles or residues that may be present in the clean room. It is thus possible to protect and maintain the interface between the epitaxial layer 2 of silicon and the passivation layer 3 with a high resistivity.

According to a second option, the formation of the passivation layer 3 is carried out in a second reactor sharing the same transfer module with the first reactor used for the epitaxial layer of silicon, under vacuum or an argon or nitrogen atmosphere. Here again, the vacuum is not broken and the base substrate 12 remains in situ, under a controlled atmosphere, preventing ex situ contaminations and guaranteeing that the interface between the epitaxial layer 2 of silicon and the passivation layer 3 exhibits a high resistivity. In addition, this second option facilitates the cleaning of the reactors. This is because the epitaxial silicon material deposited on the interior walls of the first reactor (from a few microns to a few tens of microns) during the epitaxial growth can be removed more easily if no carbonization or nitridation has been carried out over it. The passivation layer 3 formed by carbonization or nitridation in the second reactor is formed only on the silicon material, that is to say only on the epitaxial layer of silicon. Consequently, this has no impact on the parts positioned inside the second reactor since the carbonization and the nitridation are reactions occurring between the source gases and the silicon surface. The fact of carrying out stages b) and c) in separate first and second reactors makes possible better management of the cleaning and of the performance qualities of the chambers.

Of course, according to a third option, the base substrate 12 can be removed from the first reactor in order to return the base substrate 12 to the atmosphere of the clean room. In such a case, the base substrate 12 can be prepared before formation of the passivation layer, in order to clean the surface of the epitaxial layer of silicon (that is to say, to remove organic or metallic dopants or particulate contaminants) and to remove from the surface a layer of native oxide. The cleaning can be carried out with conventional wet cleaning treatments. The deoxidation can be carried out by wet or dry chemical etching. The deoxidation can alternatively be carried out after loading the base substrate 12 into the reactor, by exposing the base substrate 12 to a reducing atmosphere at a temperature of at least 800° C. This stage is not, however, compulsory and this native oxide can be retained. This is because it is thin enough, from 1 to 2 nm in thickness, not to have an insulating effect (conduction through this layer may occur by way of the tunneling phenomenon) in so far as future heat treatments will not have made it completely disappear by dissolution.

According to any one of the abovementioned options, after having been placed in a reactor, the base substrate 12 undergoes the formation of the passivation layer 3.

According to a first embodiment, stage c) comprises a carbonization of the free surface of the epitaxial layer 2 of silicon, so as to form a passivation layer 3 made of polycrystalline silicon carbide.

To do this, the base substrate 12, and more particularly the free surface of the epitaxial layer 2 of silicon, is exposed to a single carbon precursor gas at a pressure below atmospheric pressure, for example, of between 0.01 Torr and 760 Torr. The carbon precursor gas can comprise methane ($CH_4$), ethane ($C_2H_6$), propane ($C_3H_8$), acetylene ($C_2H_2$), ethylene ($C_2H_4$), and the like. The precursor gas can be introduced into the reactor (or heated inside the reactor) at a temperature of between 700° C. and 1,200° C., so that the carbon-based entities carry out a nucleation on the surface of the epitaxial layer 2 of silicon. A stream of carrier gas (such as $H_2$) can also be introduced simultaneously into the chamber but no other precursor gas than the carbon precursor gas flows over the base substrate 12. By avoiding the reaction of the carbon-based entity with other entities of a second precursor, the deposition of carbon-based compound on the wall of the reactor is limited and the generation of particles is avoided.

It has surprisingly been observed that, when this carbonization stage is carried out under a reduced partial carbon pressure, of less than 760 Torr, the nucleation of the carbon-based entity takes place on isolated islets on the surface. The silicon atoms of the base wafer then diffuse into the carbon islets, forming islets of silicon carbide that are stoichiometric or close to the state of stoichiometry of 3C/6H and 4H type. The islets coalesce to form a relatively thick layer of polycrystalline silicon carbide. When the stream of carbon precursor gas is maintained for a few minutes, the thickness of the polycrystalline layers increases up to several nanometers.

In a particular example, a carbon precursor gas made of $C_3H_8$, mixed with $H_2$ in a 180 sccm/5 slm ratio, is introduced into and circulated for 5 minutes at a pressure of 10 Torr in the chamber and is heated to 1,000° C. A polycrystalline passivation layer 3 made of silicon carbide having a thickness of 10 nm is then observed on the surface of the epitaxial layer 2 of silicon.

When the carbonization stage is carried out at a higher partial carbon pressure, of greater than 760 Torr, a completely different phenomenon takes place on the surface of the base substrate 12. The carbon-based entities carry out a nucleation with a high density on the surface and block the diffusion of the silicon atoms from this surface. A crystalline or partially crystalline layer of carbon then grows slowly on the surface, aligned with the silicon lattice, in a 3C structure. Such a layer typically exhibits a thickness of 2 nm after 10 minutes of deposition.

It consequently appears that circulating a single carbon precursor gas at reduced partial carbon pressure over the base substrate 12 is a very effective means for forming a relatively thick (greater than 5 nm or 10 nm) layer of polycrystalline silicon carbide. Such a passivation layer 3 is advantageous because, by virtue of its polycrystalline nature, it thus makes it possible to prepare and to preserve the polycrystalline nature of the charge-trapping layer 4 that is grown on the passivation layer 3. In addition, the relatively large thickness of the passivation layer 3 is formed quite rapidly and constitutes an effective barrier to diffusion for preventing the migration of doping entities from the base substrate 12 to the charge-trapping layer 4.

In addition, it has been observed that such a carbonization stage, under reduced partial pressure of carbon, incorporated very little in the way of dopants (such as boron) in the passivation layer 3 made of silicon carbide. Measurements have shown a boron concentration of less than $10^{14}$ atoms/$cm^3$ in such a layer. It is believed that the dopant entities (possibly present at the surface of the base substrate 12 or incorporated in the latter) are diffused out of the silicon carbide layer during its formation and evacuated from the deposition chamber (or reactor) with the precursor gas and carrier gas.

According to a second embodiment, stage c) comprises a nitridation of the free surface of the epitaxial layer 2 of silicon, so as to form a passivation layer 3 made of silicon nitride.

To do this, the base substrate 12, and more particularly the free surface of the epitaxial layer 2 of silicon, is exposed to a nitrogen-precursor gas at a pressure of, for example, between 0.1 Torr and 760 Torr. The precursor gas can comprise ammonia ($NH_3$). The precursor gas can be introduced into the chamber (or heated inside the chamber) at a temperature of between 800° C. and 1300° C., so that the nitrogen-based entities nucleate on the surface of the epitaxial layer 2 of silicon.

After stage c), a passivation layer made of silicon nitride is obtained. Such a passivation layer typically exhibits a thickness of less than 10 nm after 10 seconds to 60 minutes of nitridation.

Such a passivation layer 3 is advantageous because, by virtue of its non-epitaxial nature on silicon, it thus makes it possible to prepare and to preserve the polycrystalline nature of the charge-trapping layer 4 that is grown on the passivation layer 3. The passivation layer 3 is formed quite rapidly only on the silicon and constitutes an effective barrier to diffusion for preventing the migration of doping species from the base substrate 12 to the charge-trapping layer.

On the basis of either one of the first and second embodiments, after the growth of the passivation layer 3 on the base substrate 12, another stream of precursor gas, at a temperature of the order of 1,000° C., is passed through the reactor in order to form, in a conventional way, a polycrystalline charge-trapping layer 4: this is stage d) of the process according to the present disclosure. The duration of circulation of the precursor gas determines the thickness of the polycrystalline layer 4, and this duration can be chosen so as to grow a layer of 5 microns, 10 microns, or even more.

Advantageously, the passivation layer 3 and the polycrystalline charge-trapping layer 4 are formed in situ, in the same reactor or chamber. This avoids contaminating the stack of layers with dopants or contaminants originating from the ambient atmosphere and preserves the characteristics of high resistivity of the handle substrate 100.

To be complete, the handle substrate 100 can be provided with a dielectric layer 5, for example, a silicon oxide or a silicon nitride, deposited in a conventional way. The dielectric layer 5 and/or the polycrystalline charge-trapping layer 4 can also be polished, in order to provide an upper surface of the handle substrate 100 compatible with a conventional stage of transfer of a thin film 6 onto the handle substrate 100.

Of course, the present disclosure is not limited to the embodiments described and alternative embodiments can be contributed thereto without departing from the scope of the invention as defined by the claims.

The invention claimed is:

1. A handle substrate for a composite structure, comprising:
   a base substrate including an epitaxial layer of silicon on a monocrystalline silicon wafer obtained by Czochralski pulling, the monocrystalline silicon wafer exhibiting a resistivity of between 10 and 500 ohm.cm, the epitaxial layer of silicon exhibiting a resistivity of greater than 2,000 ohm.cm and a thickness ranging from 2 to 100 microns;
   a passivation layer on and in contact with the epitaxial layer of silicon, the passivation layer being amorphous or polycrystalline; and
   a charge-trapping layer on and in contact with the passivation layer;
   wherein:
   the passivation layer is a layer of silicon carbide formed by carbonization of the surface of the epitaxial layer of silicon, or
   the passivation layer is a layer of silicon nitride formed by nitridation of a surface of the epitaxial layer of silicon.

2. The handle substrate for a composite structure of claim 1, further comprising:
   a dielectric layer on and in contact with the charge-trapping layer;
   a thin film on the dielectric layer, the thin film being suitable for radiofrequency devices.

3. A method of forming a handle substrate for a composite structure, the method comprising:
   action a) providing a monocrystalline silicon wafer obtained by Czochralski pulling exhibiting a resistivity of between 10 and 500 ohm.cm;
   action b) growing an epitaxial layer of silicon on the monocrystalline silicon wafer obtained by Czochralski pulling to form a base substrate, the epitaxial layer of silicon exhibiting a resistivity of greater than 2,000 ohm.cm and a thickness ranging from 2 to 100 microns;
   action c) forming a passivation layer on the epitaxial layer of silicon, the passivation layer being amorphous or polycrystalline, wherein forming the passivation layer includes:
      a carbonization of the surface of the epitaxial layer of silicon so as to form the passivation layer made of polycrystalline silicon carbide, or
      a nitridation of the surface of the epitaxial layer of silicon so as to form the passivation layer made of silicon nitride; and
   action d) growing a polycrystalline charge-trapping layer on the passivation layer.

4. The method of claim 3, wherein forming the passivation layer includes the carbonization of the surface of the epitaxial layer of silicon so as to form the passivation layer made of polycrystalline silicon carbide, the carbonization of the surface of the epitaxial layer of silicon comprising exposing the base substrate to a single carbon precursor at a pressure below atmospheric pressure to form the passivation layer of polycrystalline silicon carbide having a thickness of at least 5 nm on the surface of the epitaxial layer of silicon.

5. The method of claim 4, wherein the single carbon precursor exhibits a temperature of between 700° C. and 1200° C.

6. The method of claim 5, wherein the passivation layer has a thickness of at least 10 nm.

7. The method of claim 6, wherein the charge-trapping layer has a thickness of greater than 5 microns.

8. The method of claim 7, wherein the charge-trapping layer comprises polycrystalline silicon.

9. The method of claim 8, wherein the actions b), c) and d) of claim 3 are all carried out successively in situ in epitaxy equipment.

10. The method of claim 9, wherein the action b) is carried out in a first reactor and the actions c) and d) are carried out in a second reactor, and wherein a transfer of the base substrate from the first reactor to the second is carried out without breaking a vacuum in which the base substrate is disposed.

11. The method of claim 7, wherein the charge-trapping layer has a thickness of greater than 10 microns.

12. The method of claim 3, wherein the passivation layer has a thickness of at least 10 nm.

13. The method of claim 3, wherein the charge-trapping layer has a thickness of greater than 5 microns.

14. The method of claim 3, wherein the charge-trapping layer comprises polycrystalline silicon.

15. The method of claim 3, wherein the actions b), c) and d) are all carried out successively in situ in epitaxy equipment.

16. The method of claim 15, wherein the action b) is carried out in a first reactor and the actions c) and d) are carried out in a second reactor, and wherein a transfer of the base substrate from the first reactor to the second is carried out without breaking a vacuum in which the base substrate is disposed.

17. The handle substrate of claim 1, wherein the passivation layer has a thickness of at least 10 nm.

18. The handle substrate of claim 1, wherein the charge-trapping layer has a thickness of greater than 5 microns.

19. The handle substrate of claim 1, wherein the charge-trapping layer comprises polycrystalline silicon.

20. The handle substrate of claim 19, wherein the charge-trapping layer has a thickness of greater than 10 microns.

* * * * *